United States Patent [19]
Evel et al.

[11] Patent Number: 4,529,930
[45] Date of Patent: Jul. 16, 1985

[54] PROGRAMMABLE DELAY FOR DIGITIZER CIRCUITS

[75] Inventors: Eddie A. Evel, Colorado Springs; Robert M. Landgraf, Woodland Park; Walter A. Fischer; William B. Risley, both of Colorado Springs, all of Colo.

[73] Assignee: Hewlett-Packard Company, Palo Alto, Calif.

[21] Appl. No.: 291,202

[22] Filed: Aug. 10, 1981

[51] Int. Cl.³ .............................................. G01R 23/16
[52] U.S. Cl. ................................. 324/77 A; 315/377; 324/77 R
[58] Field of Search ............... 324/77 R, 77 B, 77 C, 324/77 CS, 77 A, 111, 112, 121 R; 315/377

[56] References Cited

U.S. PATENT DOCUMENTS

| | | | |
|---|---|---|---|
| 3,249,796 | 5/1966 | Moffitt | 315/377 |
| 3,427,536 | 2/1969 | Wainwright | 324/77 B |
| 3,816,815 | 6/1974 | Schumann | 324/112 |
| 3,836,851 | 9/1974 | Schumann | 324/112 |
| 4,041,387 | 8/1977 | Dalichow | 324/77 C |
| 4,155,037 | 5/1979 | Mazur | 324/111 |
| 4,306,186 | 12/1981 | Nakazawa | 324/77 B |

OTHER PUBLICATIONS

Baud, "Oscilloscope et Retard Numérique", Toute l'Electronique, No. 420, pp. 35-41, (Feb. 1978).

*Primary Examiner*—Michael J. Tokar
*Attorney, Agent, or Firm*—Douglas A. Kundrat

[57] ABSTRACT

A digitizer circuit for converting analog waveforms displayed upon a CRT screen into digital signals suitable for storage in memory employs a microprocessor to determine, from user-specified parameters, the times at which the output of the CRT vertical amplifier is to be sampled. The user has great flexibility in defining sample resolution and the location of the sample window on the displayed waveform in which the samples are to be taken and is permitted to intensify the sample window on the CRT display before any samples are taken in order to view the sample window in relation to the remainder of a displayed waveform.

8 Claims, 2 Drawing Figures

PROGRAMMABLE DELAY FOR DIGITIZER CIRCUITS

BACKGROUND AND SUMMARY

A digitizer circuit is used to digitize an electrical waveform by performing a transformation from an analog to a digital format in order that storage in memory and subsequent data manipulation may be facilitated by the use of digital circuitry. It is known in the prior art, as exemplified by the Hewlett-Packard Model 1150A waveform analyzer, to perform such digitization by sampling a waveform a fixed number of times over a sample window or user-defined width. A disadvantage of such a prior art digitizer is the inability to depict the location on the waveform of the sample window prior to digitization.

The present invention is directed to a digitizer circuit which digitizes a waveform displayed upon a cathode ray tube (CRT) by sampling the output of the CRT vertical amplifier. The user specifies the sample location by specifying the offset between the CRT trigger signal and the first sample, the width of the sample window, and the number of samples to be taken. From these user-specified parameters of microprocessor is used to determine and implement the necessary delay between the CRT trigger signal and each sample taken by a sample-and-hold circuit.

An advantage of the present invention is the high degree of flexibility the user is permitted in defining an arbitrary portion of the displayed waveform as the sample window. Another advantage is the ability to depict the sample window as an intensified portion of the displayed waveform, thereby allowing the user to view the sample window in relation to the entire displayed waveform prior to digitization.

DESCRIPTION OF THE PREFERRED EMBODIMENT

Figure 1:
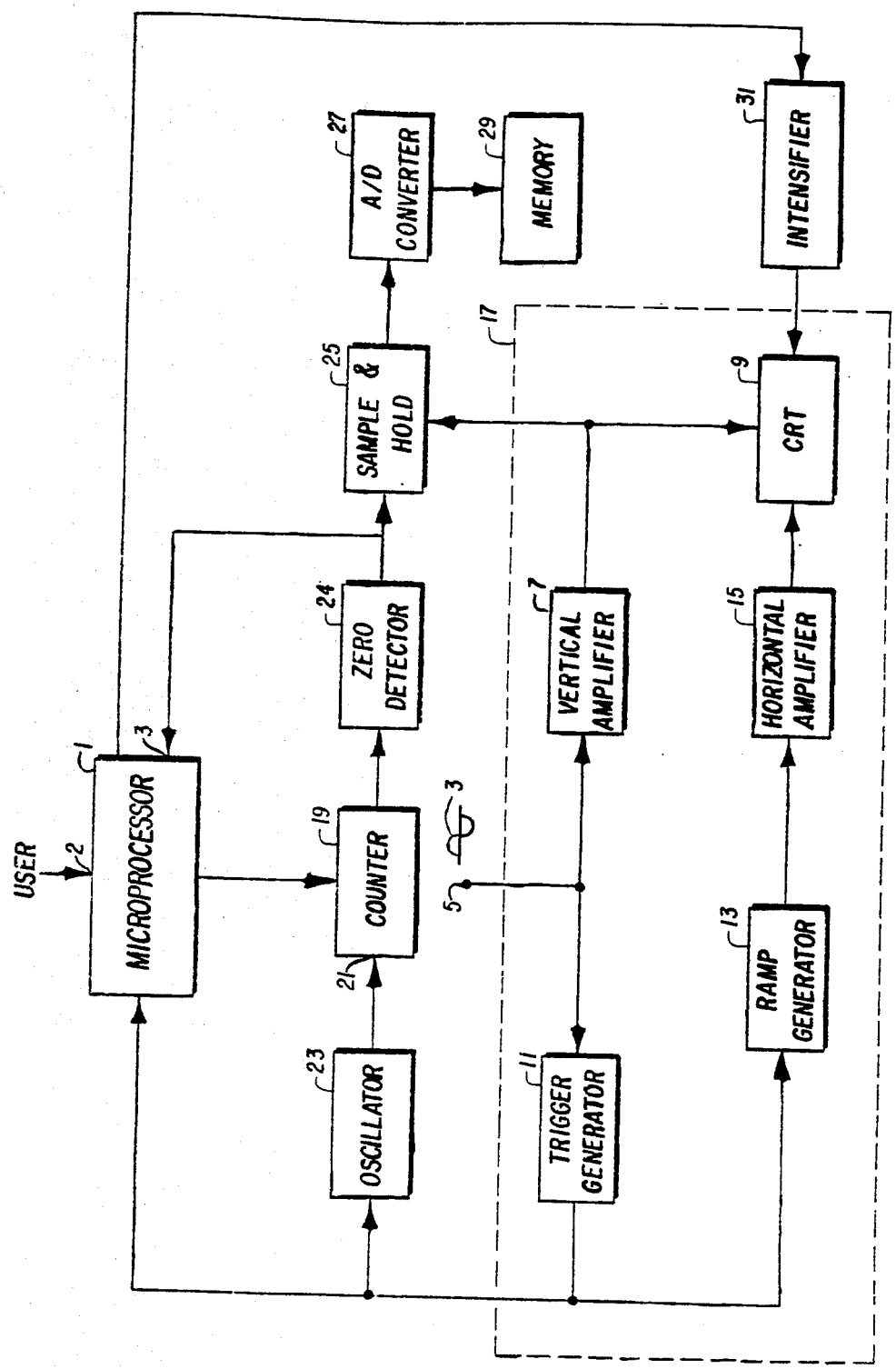
FIG. 1 is a block diagram of a preferred embodiment of the present invention.

Referring now to FIG. 1 there is shown a block diagram of a preferred embodiment of the present invention. Prior to commencing the digitization process the user enters the user-specified paramters (number of samples desired ($N_D$), sample window width ($W_D$), and offset between the trigger signal and the first sample ($O_D$) into an input 2 of a microprocessor 1 in a conventional manner such as through a panel mounted keyboard or through panel mounted switches. Microprocessor 1 is programmed and interfaced in a conventional manner and may comprise any of a number of commercially available microprocessor chips such as the Intel 8085A.

During operation of the CRT display, whether or not digitization is performed, an input waveform 3 is received at an input node 5 and is amplified by a vertical amplifier 7 before being applied to a CRT 9 to cause vertical deflection of the CRT beam. Input waveform 3 is also used to cause a trigger generator 11 to generate a trigger signal when waveform 3 exceeds a predetermined threshold level. The trigger signal causes a ramp generator 13 to initiate generation of a ramp signal which is amplified by a horizontal amplifier 15 and is used to sweep the beam across the screen of CRT 9. A display circuit 17 used in the present invention operates in a conventional manner and may utilize the same components as those used in commercially available oscilloscopes such as the Hewlett-Packard 1740A.

When a waveform displayed upon the screen of CRT 9 is to be digitized one sample of the waveform is taken during each horizontal sweep of the beam across the screen of CRT 9. Microprocessor 1 is used to determine the time delay ($T_D$) required between generation of the trigger signal by trigger generator 11 and the time at which the next sample is to be taken. Microprocessor 1 receives the user-specified parameters ($N_D$, $W_D$, $O_D$) at input 2 and receives a sample pulse, described below, at input 3, each time a sample is taken, thereby causing a counter internal to microprocessor 1 to record the total number of samples already taken ($S_T$). Microprocessor 1 computes $T_D$ as defined by the relation wherein $T_D = ((S_T W_D)/(N_D - 1)) + O_D$. Microprocessor 1 computes $T_D \times F$ (F being the oscillation frequency of an oscillator 23) and loads the BCD representation thereof into a counter 19. Counter 19 comprises an 8-digit BCD down-counter having a clock input 21 at which a sinusoidal signal is received from oscillator 23 for causing counter 19 to decrement its count by one for each cycle. It is well within the level of ordinary skill in the art to construct counter 19 from any of a number of commercially available TTL counters such as by cascading, in a conventional manner, 8 Texas Instruments 74LS168A counters. To provide a sampling resolution on the displayed waveform of 100 nanoseconds, oscillator 23 is arranged to oscillate at a frequency (F) of 10 MHz with oscillation starting upon receipt of a trigger pulse from trigger generator 11. Thus, the count within counter 19 will be 0 after $T_D \times F$ decrements which corresponds to a time delay of $T_D$ after generation of a trigger pulse by trigger generator 11.

A zero detector 24 detects the zero state of counter 19 and generates a sample pulse in response thereto. Zero detector 24 may be implemented by connecting the outputs of all of the flip-flops of counter 19 to a standard TTL NOR gate which generates a logic "1" output when the zero state is achieved. The sample pulse is received at input 3 of microprocessor 1 causing $S_T$ to be incremented as described hereinabove. The sample pulse also causes a sample and hold circuit 25 to sample the output of vertical amplifier 7. For operations involving bandwidths of less than 200 KHz sample and hold circuit 25 may comprise a commercially available device such as the Harris HA-2425. For higher speed operations, sample and hold circuit 25 may comprise a high speed circuit such as that employed in the Hewlett-Packard Model 1810A sampler which provides a bandwidth of approximately 1 GHz.

An A/D converter 27 converts the sampled data resident in sample and hold circuit 25 into a representative 10-bit digital word. A/D converter 27 may comprise any of a number of commercially available circuits which are 10 bits wide and have conversion times of less than 10 microseconds.

The digital representation of the sampled data is stored in a conventional manner in sequential memory locations within a memory 29 which may comprise, for example, a random access memory such as the Intel 2142. In order to later reconstruct the sampled waveform from the stored data it is necessary to also store the time interval between samples ($T_I$) in memory 29. Microprocessor 1 computes $T_I$ as $T_I = (W_D)/(N_D - 1)$ and loads the digital representation of $T_I$ into memory 29. From memory 29 the sampled data may be sent through a data buss in a conventional manner to other devices such as plotters or calculators for further data manipulation. The data may also be used to display the digitized waveform upon the screen of CRT 9 with or without simultaneous display of the real-time waveform by using display circuitry such as that employed in the Hewlett-Packard Model 1350S Computer Graphics Display System.

An important feature of the present invention is the ability to depict at any time that portion of the displayed waveform which is to be digitized as a visually distinct portion of the entire displayed waveform. This feature is implemented by arranging microprocessor 1 to cause an intensifier 31 to write the sample window portion of the displayed waveform at a higher level of intensity than the remainder of the waveform in order to render it visually distinct.

Figure 2:
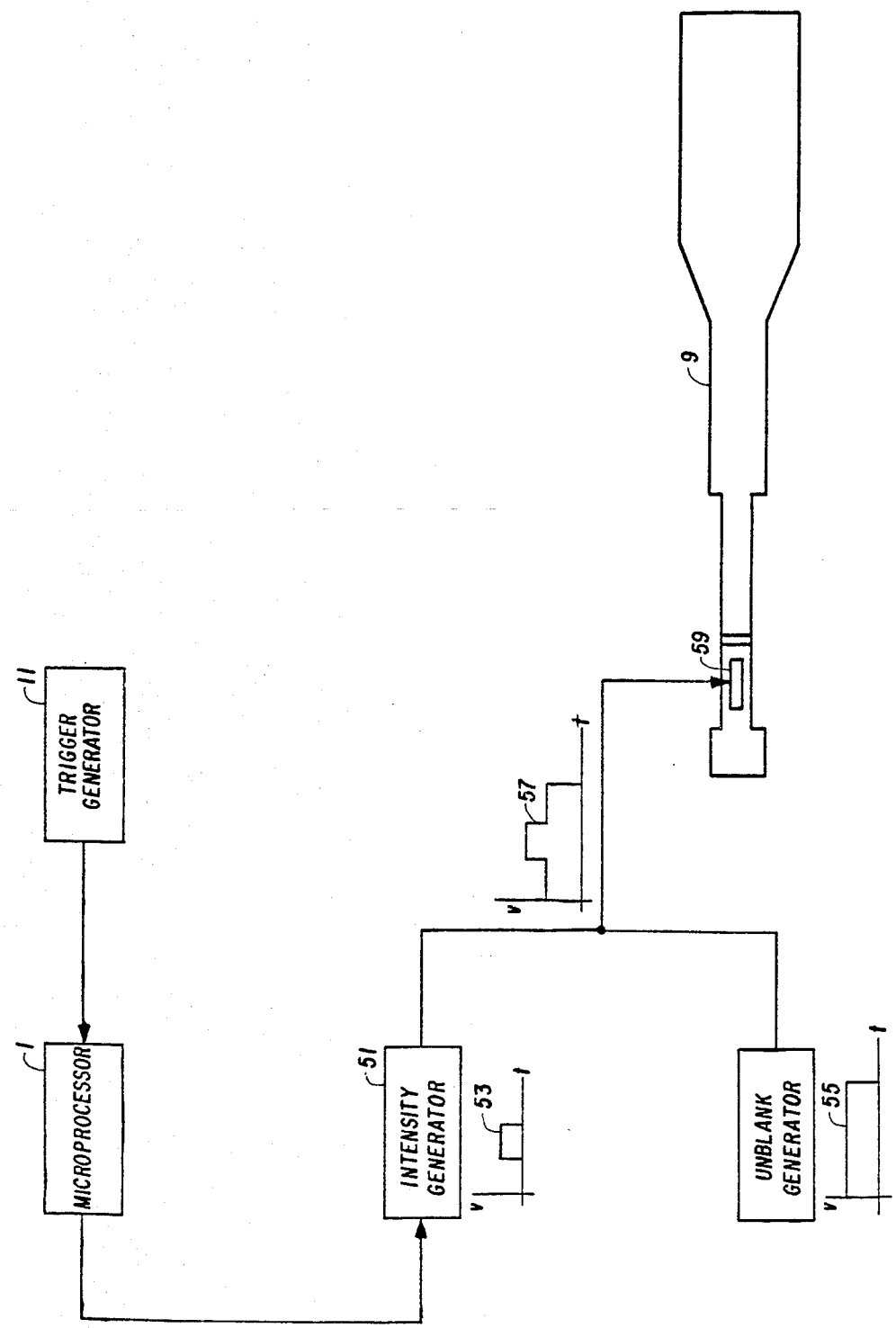
FIG. 2 is a block diagram of the intensifier of FIG. 1.

Referring now to FIG. 2, there is shown a diagram of the operation of intensifier 31. It is well known in the prior art to use a positive-going unblanking pulse 55 to bias the grid 59 of CRT 9 above cutoff only while the CRT screen is being swept so as to eliminate any retrace illumination. In order to intensify the sample window portion of the trace, microprocessor 1 operates to trigger an intensity generator 51 into the "on" state with a positive impulse at time $O_D$ (after a trigger pulse is received from trigger generator 11) and into the "off" state with a negative impulse at time $O_D+W_D$ so that intensity generator 51 generates an intensity pulse 53 having a leading edge at time $O_D$ and a trailing edge at time $O_D+W_D$. Intensity generator 51 may comprise, for example, a pulse generator having a design similar to the unblank generator commonly employed in commercially available oscilloscopes such as the Hewlett-Packard Model 1740A.

Intensity pulse 53 is superimposed onto an unblank pulse 55 to create a grid pulse 57 which is applied to grid 59 of CRT 9. Thus, no trace is present when the grid pulse 57 goes to O (retrace). When the grid pulse 57 comprises only unblank pulse 55 the grid voltage exceeds cutoff and a trace is visible. When grid pulse 57 comprises the superposition of intensity pulse 53 onto unblank pulse 55 the grid voltage is increased, in turn causing the beam current to increase. This increase in beam current appears as an intensified portion of the displayed trace.

We claim:

1. A display circuit for receiving a signal and for displaying a representative trace, the circuit comprising:

trigger means for receiving the signal and for generating a trigger signal when the signal exceeds a predetermined trigger level;

a cathode ray tube having a gun which is operative for emitting a beam and a screen which is operative for receiving the beam and, responsive thereto, for displaying the trace;

vertical deflection means, having an output coupled to the gun, for receiving the signal and for causing the beam to deflect vertically in response thereto;

horizontal sweep means, having an input coupled to the trigger means and an output coupled to the gun, for receiving the trigger signal and, responsive thereto, for causing the beam to sweep horizontally across the screen;

unblank means, coupled to the gun, for maintaining the beam intensity at a write level during a write portion of the horizontal sweep and for decreasing the beam intensity during a retrace portion of the horizontal sweep; and intensifier means, coupled to the gun, for increasing the beam intensity above the write level during a window portion of the horizontal sweep write portion, said intensifier means comprising:

logic means, coupled to the trigger means, for receiving the trigger signal and for determining the location of the window portion relative to said trigger signal; and pulser means, coupled to the trigger means and to the gun, for presenting a voltage pulse to the grid of the gun during the window portion.

2. A circuit as in claim 1, wherein the logic means presents a start impulse to the pulser means at the start of the window portion and a stop impulse at the end of the window portion.

3. A circuit as in claim 2, wherein the logic means determines the location of the window portion relative to the trigger signal from a predetermined offset and a predetermined duration.

4. A circuit for receiving and digitizing a signal and for displaying a representative trace, the circuit comprising:

trigger means for receiving the signal and for generating a trigger signal when the signal exceeds a predetermined trigger level;

a cathode ray tube having a gun which is operative for emitting a beam and a screen which is operative for receiving the beam and, responsive thereto, for displaying the trace;

vertical deflection means, having an output coupled to the gun, for receiving the signal and for causing the beam to deflect vertically in response thereto;

horizontal sweep means, having an input coupled to the trigger means and an output coupled to the gun, for receiving the trigger signal and, responsive thereto, for causing the beam to sweep horizontally across the screen;

unblank means, coupled to the gun, for maintaining the beam intensity at a write level during a write portion of the horizontal sweep and for decreasing the beam intensity during a retrace portion of the horizontal sweep;

intensifier means, coupled to the gun, for increasing the beam intensity above the write level during a window portion of the horizontal sweep write portion; and digitizing means, coupled to the vertical deflection means, for sampling the output of the vertical deflection means during the window portion.

5. A circuit as in claim 4, wherein the digitizing means comprises:

logic means, coupled to the trigger means, for determining the location of the window portion relative to the trigger signal; and sampling means, coupled to the logic means and to the vertical deflection means, for sampling the output of the vertical deflection means during the window portion.

6. A circuit as in claim 5, wherein the logic means determines the location of the window portion relative to the trigger signal from a predetermined offset and a predetermined duration.

7. A circuit as in claim 6, wherein the sampling means samples the output of the vertical deflection means a predetermined number of times within the window portion.

8. A circuit as in claim 7, wherein the sampling means takes one sample per horizontal sweep.

* * * * *